United States Patent
Aue

(10) Patent No.: US 6,690,153 B2
(45) Date of Patent: Feb. 10, 2004

(54) METHOD OF TESTING AND/OR MONITORING THE SYSTEM FREQUENCY OF A MICROCONTROLLER AND A MICROCONTROLLER

(75) Inventor: Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 3 days.

(21) Appl. No.: 10/034,490

(22) Filed: Dec. 27, 2001

(65) Prior Publication Data
US 2002/0105315 A1 Aug. 8, 2002

(30) Foreign Application Priority Data
Dec. 28, 2000 (DE) .......................... 100 65 119

(51) Int. Cl.[7] .................. G01R 23/02; G01R 23/14; H03B 1/00
(52) U.S. Cl. .................. 324/76.39; 324/76.41; 331/74
(58) Field of Search .................. 324/76.39, 76.41, 324/76.47, 607; 377/19; 331/17, 23, 25, 18, 74, 44, 1 R

(56) References Cited

U.S. PATENT DOCUMENTS

| 4,374,358 A | * | 2/1983 | Hirose ..................... 324/76.58 |
| 4,603,292 A | * | 7/1986 | Russell .................... 324/76.39 |
| 5,705,955 A | * | 1/1998 | Freeburg et al. ............ 331/14 |

FOREIGN PATENT DOCUMENTS

DE  197 22 114  12/2000

* cited by examiner

Primary Examiner—Anjan K. Deb
(74) Attorney, Agent, or Firm—Kenyon & Kenyon

(57) ABSTRACT

A method of testing and/or monitoring the system frequency of a microcontroller, in which the working frequency of a voltage-regulated oscillator or VCO, which is in an operative connection with the microcontroller, is measured, and the system frequency being determined and/or checked on the basis of the measured working voltage.

5 Claims, 1 Drawing Sheet

METHOD OF TESTING AND/OR MONITORING THE SYSTEM FREQUENCY OF A MICROCONTROLLER AND A MICROCONTROLLER

FIELD OF THE INVENTION

The present invention relates to a method of testing and/or monitoring the system frequency of a microcontroller, and also relates to a microcontroller designed with the corresponding testing and monitoring apparatus, arrangement or structure.

BACKGROUND INFORMATION

In microcontrollers, it is believed that there have been problems in conjunction with checking the system frequency, because all the frequencies of the microcontroller system may be derived from a quartz oscillator assigned to the microcontroller. While a second frequency standard or a second quartz oscillator might be used, it is believed that this would be associated with additional costs and a greater complexity.

If problems occur with such a quartz oscillator, or if it fails completely, the function of the respective microcontroller or control unit may only be disturbed or cannot be maintained at all. If, for example, such a failure occurs in important automotive control units such as the engine control unit, it can lead to a complete operating failure of the motor vehicle.

In this regard, German Published Patent Application No. 197 22 114 refers to a clock signal producing device and use of a quartz oscillator.

SUMMARY OF THE INVENTION

The exemplary method and/or exemplary embodiment of the present invention is intended to make available the simplest possible method of testing and monitoring the system frequency of a microcontroller.

According to the exemplary method and/or exemplary embodiment of the present invention, the system frequency of a microcontroller may be determined without providing a second frequency, i.e. a direct frequency measurement. It is believed that this is because the working voltage of a voltage-regulated oscillator or VCO, which is used according to the exemplary method and/or exemplary embodiment of the present invention, is a measure of the frequency at which this oscillator oscillates.

The working voltage of the VCO may be expediently measured by an A/D converter. A digital signal made available through such an A/D converter may be coded in a suitable manner, so that a simple reference to the system frequency to be tested is able to be derived.

In another exemplary method and/or exemplary embodiment involving the exemplary microcontroller according to the present invention, the system frequency derivable from the measured operating voltage of the VCO may be compared with a clock frequency of a quartz oscillator assigned to the microcontroller. With such a comparison, it is believed that the clock frequency of the quartz oscillator may be easily checked.

In addition to the VCO and the A/D converter, the microcontroller may be expediently equipped with a quartz oscillator. It is believed that system frequencies may be checked very accurately with such a microcontroller.

DETAILED DESCRIPTION

Figure 1:
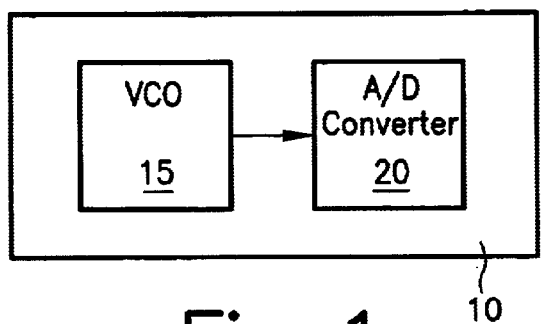
FIG. 1 shows a schematic block diagram illustrating a first exemplary embodiment of the microcontroller according to the present invention.

FIG. 1 shows an exemplary embodiment of the microcontroller 10 according to the present invention.

The microcontroller has a VCO 15 and an A/D converter 20. In this embodiment, the VCO, which may receive a working voltage, supplies the system frequency or the clock frequency of the microcontroller. The apparatus, arrangement or structure for supplying the working voltage for the VCO are not explicitly shown. The A/D converter is in an operative connection to the VCO such that it is able to measure the working voltage and convert it to a suitably encoded digital signal. The resulting output signal of the A/D converter describes on the whole the system frequency made available by the VCO.

Figure 2:
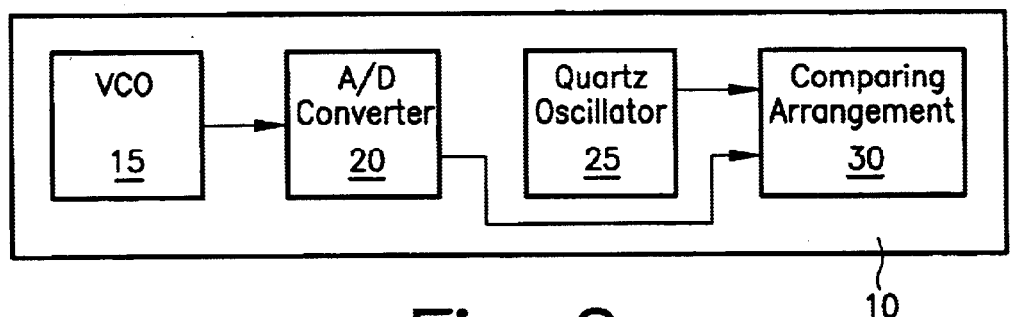
FIG. 2 shows a schematic block diagram illustrating a second exemplary embodiment of the microcontroller according to the present invention.

FIG. 2 shows another exemplary embodiment of the microcontroller according to the present invention. In addition to the embodiment from FIG. 1, microcontroller 10 shown in FIG. 2 has a quartz oscillator 25. According to this embodiment, quartz oscillator 25 supplies the system frequency under "normal" operating conditions. Components 15 and 20 are in the same operative connection as already described with reference to FIG. 1. It should be pointed out in this connection that both VCO 15 and A/D converter 20 fulfill or may fulfill other functions not shown in detail here in the context of a microcontroller.

By comparing with arrangement 30 the system frequency supplied by the quartz oscillator and the digital signal derivable from the voltage measurement of the VCO, the system frequency may be checked or monitored. When a defective system frequency is found, the quartz oscillator 25 may be shut down, and the system frequency may be supplied via the VCO in the same way as the first embodiment.

Figure 3:
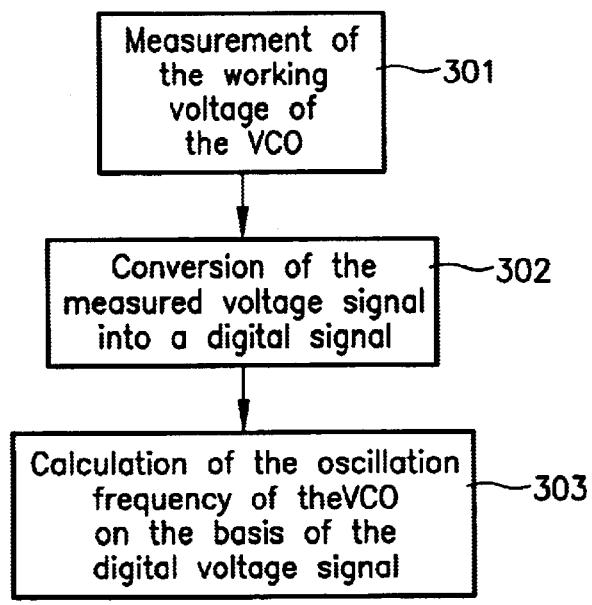
FIG. 3 shows a flow chart illustrating an exemplary method according to the present invention.

Finally, FIG. 3 illustrates an exemplary method according to the present invention on the basis of a flow chart.

In a step 301, first the working voltage of VCO 15 is measured by A/D converter 20.

In a next step 302, the A/D converter converts the measured voltage signal into a digital signal.

Finally in a step 303, the oscillation frequency of the VCO is calculated on the basis of the digital voltage signal, and such a calculation is expediently facilitated through suitable coding of the digital voltage signal.

As already explained, additional method steps not explicitly detailed here may be used to compare the measured voltage signal describing the oscillation frequency of the VCO with a clock frequency of a quartz oscillator.

What is claimed is:

1. A method of at least one of testing and monitoring a system frequency of a microcontroller, the method comprising:
   measuring a working frequency of a voltage-regulated oscillator (VCO) that is operatively connected with the microcontroller; and
   at least one of determining and checking the system frequency based on the measured working voltage,
   wherein the measured working voltage includes a measure of a frequency at which the VCO oscillates.

2. The method of claim 1, wherein an A/D converter is used to measure the working voltage of the VCO.

3. The method of claim 1, wherein the system frequency is derivable from the measured working voltage of the VCO, and the system frequency is compared with a clock frequency of a quartz oscillator assigned to the microcontroller.

4. A microcontroller comprising:

a voltage-regulated oscillator (VCO); and an A/D converter arrangement;

wherein the microcontroller includes and arrangement to apply a working voltage of the VCO to the A/D converter, which is used to measure the working voltage of the VCO, and wherein the measured working voltage includes a measure of a frequency at which the VCO oscillates.

5. The microcontroller of claim 4, wherein the microcontroller includes:

a quartz oscillator; and a comparing arrangement to compare one of a system frequency and an oscillation frequency of the VCO, derivable from the working voltage, with a clock frequency of the quartz oscillator.

* * * * *

UNITED STATES PATENT AND TRADEMARK OFFICE
CERTIFICATE OF CORRECTION

PATENT NO. : 6,690,153 B2
DATED : February 10, 2004
INVENTOR(S) : Aue

It is certified that error appears in the above-identified patent and that said Letters Patent is hereby corrected as shown below:

Column 2,
Line 59, change "frequency" to -- voltage --

Column 3,
Line 9, change "and" to -- an --

Signed and Sealed this

Second Day of August, 2005

JON W. DUDAS
*Director of the United States Patent and Trademark Office*